(12) United States Patent
Wiggins

(10) Patent No.: US 6,638,360 B2
(45) Date of Patent: Oct. 28, 2003

(54) METHODS FOR THE SEPARATION OF ISOMERS

(75) Inventor: Phillipa M. Wiggins, Auckland (NZ)

(73) Assignee: Biostore New Zealand Limited, Parnell (NZ)

( * ) Notice: Subject to any disclaimer, the term of this patent is extended or adjusted under 35 U.S.C. 154(b) by 23 days.

(21) Appl. No.: 10/005,434

(22) Filed: Dec. 5, 2001

(65) Prior Publication Data

US 2003/0105305 A1 Jun. 5, 2003

(51) Int. Cl.[7] .......................... C13J 1/06; C07C 229/00; C07C 227/00
(52) U.S. Cl. ...................... 127/46.1; 127/46.2; 562/433; 562/554
(58) Field of Search ............................. 127/46.1, 46.2; 562/433, 554

(56) References Cited

FOREIGN PATENT DOCUMENTS

GB          1007665      * 10/1965

OTHER PUBLICATIONS

Zolotarev et al, "Ligand Exchange Chromatography for Analysis and Preparative Separation of Tritium–Labelled Amino Acids" J of Radioanalytical and Nuclear Chem., Articles. vol. 121(2), PP. 469–478 (1988).*

Wiggins, Phillipa, "High and Low Density Water in Gels" Prog. Polym. Sci. vol. 20, pp. 1121–1163. (1995).*

Wiggins, Philippa M., "High and Low Density Intracellular Water", *Cellular and Molecular Biology*, vol. 47, No. 5, pp. 735—744 (2001).

* cited by examiner

*Primary Examiner*—Bruck Kifle
*Assistant Examiner*—Zachary C. Tucker
(74) *Attorney, Agent, or Firm*—Ann W. Speckman; Janet Sleath

(57) ABSTRACT

Methods for the separation of chaotropic and kosmotropic enantiomers within a racemic mixture are provided. Such methods comprise differentially partitioning the enantiomers into stabilized microdomains of low density water and high density water abutting a porous surface.

19 Claims, 15 Drawing Sheets

METHODS FOR THE SEPARATION OF ISOMERS

FIELD OF THE INVENTION

This invention relates to the separation of racemic mixtures of optical isomers and other similar molecules into their separate isomeric components. More specifically, the present invention relates to methods for the separation of optical isomers employing differential partitioning of the molecules between high and low density water microdomains.

BACKGROUND OF THE INVENTION

Most biomolecules have at least one asymmetric carbon atom and, therefore, exist as optical isomers, known as enantiomers, which are mirror images of each other. Many synthetic drugs also contain asymmetric carbon atoms. However, since their synthesis is abiotic, the synthetic product is a racemic mixture consisting of equal concentrations of enantiomers. Since proteins and other biologically active molecules have chiral centers at which the molecules act, enantiomers generally have different biological actions, with one enantiomer being more effective than the other. In some cases the enantiomers appear to be antagonistic.

One solution to this problem is to carry out syntheses which result in a single enantiomer, such as those performed by Sepracor Inc. (Marlborough, Mass.). However, such methods are often tedious and expensive. The other solution is to resolve the racemic mixture into separate isomeric compounds. This is difficult to achieve on a preparative scale, with methods presently used for such separations generally relying on specific interactions of the enantiomers on a chiral column. While many drugs are now resolved into their separate isomers during synthesis, there remains a need for a simple and inexpensive method for the resolution of any racemic mixture.

SUMMARY OF THE INVENTION

The present invention provides methods for the separation of enantiomers in a racemic mixture by differentially partitioning the enantiomers into regions of low density water and high density water abutting a porous surface. In preferred embodiments, the porous surface comprises a matrix of small-pored beads. Preferably, the beads comprise pores less than 5 nm in diameter, more preferably less than 3 nm in diameter and most preferably between 1 and 3 nm in diameter.

Matrices of small-pored beads, such as polyamide gels and ion exchange resins, contain separated microdomains of high and low density water. Solutes can be classified into chaotropes or kosmotropes according to their partitioning between these microdomains. Chaotropes partition selectively into low density water and induce high density water, while kosmotropes partition into high density water and induce low density water. In order to separate chaotropes from kosmotropes, the microdomains of high and low density water must be stabilized by balancing chaotropes against kosmotropes and preventing creation of osmotic pressure gradients between the microdomains. When the microdomains are stabilized, the matrix, or gel, is also at its maximum volume. At the particular solution composition at which this balance is achieved, chaotropes, such as D-glucose and L-amino acids, are retained on a polyamide gel and can then be eluted using a solution of a strong chaotrope which breaks down low density water.

More specifically solutes which can break down low density water in a polyamide gel, and can therefore be used to elute chaotropes, include the chaotropes $K^+$, $Rb^+$, $Cs^+$, $HCO_3^-$, $H_2PO_4^-$, $NO_3^-$, $HSO_4^-$, and tetramethyl ammonium ion. Solutes which stabilize low density water in a polyamide gel, and which can therefore be used to elute kosmotropes, include $Mg^{2+}$, $Ca^{2+}$, $H^+$, $Li^+$, $Na^+$, $SO_4^{2-}$, $HPO_4^{2-}$, $F^-$, $OH^-$ and hydrophobic solutes such as ethanol, propanol, benzyl alcohol and butanol.

Small-pored cation and anion ion exchange resins contain microdomains of both high and low density water. The stability of these microdomains in cation exchange resins increases with change of counter ion from $Na^+$, $Li^+$ or $H^+$ to $K^+$, $Rb^+$ or $Cs^+$ and especially to $Ca^{2+}$ or $Mg^{2+}$. The stability of the microdomains in anion exchange resins increases with change of counter ion from $OH^-$ or $F^-$ to $Cl^-$, $Br^-$ or $I^-$ and especially to $SO_4^{2-}$. Chaotropes, such as L-amino acids and D-glucose, can be eluted from ion exchange resins with aqueous solutions of kosmotropes, such as $Mg^{2+}$, $Ca^{2+}$, $H^+$, $Li^+$, $Na^+$, $SO_4^{2-}$, $HPO_4^{2-}$, $F^-$ and $OH^-$ and hydrophobic solutes such as ethanol, propanol, benzyl alcohol and butanol. Kosmotropes, such as D-amino acids and L-glucose, can be eluted from ion exchange resins with solutions of chaotropes, such as $K^+$, $Rb^+$, $Cs^+$, $HCO_3^-$, $H_2PO_4^-$, $NO_3^-$ $HSO_4^-$, and tetramethyl ammonium ion. In addition, all solutes, both kosmotropic and chaotropic, can be eluted from ion exchange resins by neutralizing the resins.

In one aspect, the present invention thus provides a method for separating a mixture of a kosmotropic enantiomer and a chaotropic enantiomer comprising: (a) providing a matrix of small-pored beads; (b) stabilizing microdomains of high density water and low density water within the matrix; (c) contacting the stabilized matrix with the mixture of enantiomers; (d) contacting the matrix with a solution that breaks down low density water in the matrix, wherein the chaotropic enantiomer is eluted from the matrix; and (e) contacting the matrix with a solution that stabilizes low density water in the matrix, whereby the kosmotropic enantiomer is eluted from the matrix.

The above-mentioned and additional features of the present invention and the manner of obtaining them will become apparent, and the invention will be best understood by reference to the following more detailed description, read in conjunction with the accompanying drawings.

BRIEF DESCRIPTION OF THE DRAWINGS

Preferred embodiments of the applicants' invention will be described with reference to the drawings, in which.

DETAILED DESCRIPTION OF THE INVENTION

Figure 1:
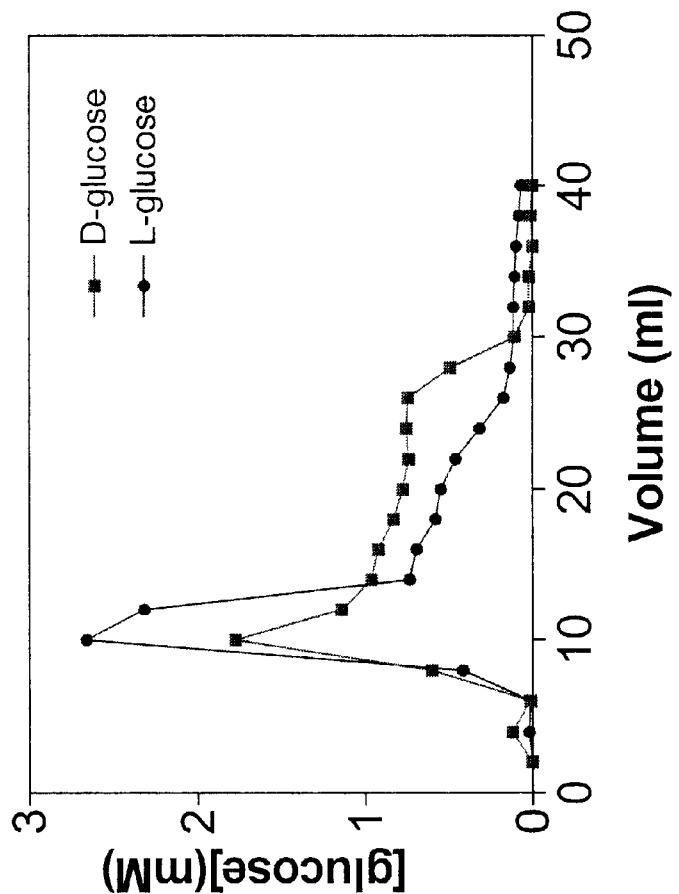
FIG. 1 shows the elution of D- and L-glucose from a Bio-Gel P-6 (BioRad Laboratories, Richmond, Calif.) column. 1 g of dry gel was pre-treated with 0.2 M n-BuOH for 24 h. A 1 ml sample (40 mM DL-glucose, 0.2 M BuOH) was then put on the column and eluted with 0.2 M BuOH.

It has been observed that small-pored polyamide gel beads and small-pored ion-exchange beads (both anion- and cation-selective) contain populations of high density and low density water molecules, known as microdomains, which have different solvent properties (Wiggins, P M (1990) *Microbiol. Rev.* 54:432–449; Wiggins, P M (1996) *Cell Biol. Internat.* 20:429–435; Wiggins, P M (1995) *Progress in Polymer Science Prog. Polymer Sci.* 20:1121–1163; Wiggins, P M (2001) *Cell. Mol. Biol.* (in press); Wiggins, P M (2001) In: Proceedings of Symposium on the Properties of Water p. 2000). Low density water preferentially dissolves $K^+$, $Rb^+$, $Cs^+$, $HCO_3^-$, $H_2PO_4^-$, $NO_3^-$, $HSO_4^-$, and tetramethyl ammonium ion. These ions are called chaotropes because they induce high density water; i.e. they displace the equilibrium between high and low density microdomains toward high density water, thus decreasing the structure of water and increasing its entropy, reactivity and fluidity. High density water preferentially dissolves $Mg^{2+}$, $Ca^{2+}$, $H^+$, $Li^+$, $Na^+$, $SO_4^{2-}$, $HPO_4^{2-}$, $F^-$ and $OH^-$. These ions are called kosmotropes because they induce low density water; i.e. they displace the equilibrium between high and low density water microdomains toward low density water, thus increasing the structure of water and decreasing its entropy and fluidity. Hydrocarbons are also kosmotropes. D-amino acids and L-glucose are kosmotropes, while L-amino acids and D-glucose are chaotropes.

In simple solutions, these solvent properties cannot be measured separately because the smallest sample of water contains both kinds of microdomain. At surfaces, however, the microdomains are no longer randomly distributed and a single type of microdomain can be probed for its solvent properties. A polyamide surface, for example, induces high density water immediately adjacent to its hydrophilic surface and low density water further out from the surface. When the pores of a polyamide gel are between 1–3 nm in diameter, their contained water is extremely enriched in low density water, which selectively accumulates chaotropes and excludes kosmotropes. The presence of microdomains of high and low density water within small-pored materials such as polyamide gels and ion exchange resins can thus be used to separate a chaotropic enantiomer from a kosmotropic enantiomer.

In order to use this property to separate similar solutes, the integrity of the microdomains must be protected by balancing kosmotropes in the external solution with chaotropes in the internal solution contained within the pores. Without this balance, a chaotrope accumulates into the low density water, creating an osmotic pressure gradient which is abolished by conversion of the low density water to high density water. The chaotrope then exits, and there is no retention of the solute on the gel.

Examples 2–5 (FIGS. 1–7) below describe experiments in which enantiomers were separated using columns of BioGel P-6 (Bio-Rad Laboratories, Richmond, Calif.) and of Dowex 50WX16 (Dow Chemical Company, Midland, Mich.). Bio-Gel P-6 is a gel of polyacrylamide beads prepared by copolymerization of acrylamide and N,N'-methylene-bis-acrylamide. It is extremely hydrophilic and essentially non-ionic. Dowex 50WX16 is a cation exchange resin with approximately 16% cross-linkage. The columns were first preequilibrated for a stated time with an aqueous solution of a kosmotrope (usually butanol). A solution of DL-glucose, DL-lysine or DL-potassium glutamate was then put on the gel and eluted with the first eluting solution which was either water or the preparative solution of kosmotrope. The gel columns retained one enantiomer more than the other. The retained enantiomer was then eluted by converting the retaining water into the type with low affinity for the retained solute. Solutions considerably enriched one enantiomer or the other were thus obtained. These experiments were proof of principle that separated microdomains of water existed in the gels and could be used to separate D- and L-enantiomers. In the charged Dowex gels, both enantiomers were sometimes retained, but could be eluted separately by sequential elutions, the first of which converted low density water to high density water and the second of which converted high density water to low density water. Alternatively, the solute retained in low density water may be eluted under pressure.

The retention of the enantiomers was not due to chiral centres on the gel matrix because the gel beads were synthetic. The different populations of water molecules were believed to be a consequence of the coexistence of high and low density microdomains of pure liquid water (Mishima, O and Stanley, H E (1998) *Nature* 392:164–168; Mishima, O and Stanley, H E (1998) *Nature* 396:329–335; Vedamuthu, M. et al. (1994) *J. Phys. Chem.* 98:2222–2230; Robinson, G W and Cho, C H (1999) *Biophys. J.* 77:3311–3318). The difference in density of these two types of water (30%), with a corresponding difference in water—water bonding strengths, can account for the differences in solvent properties.

The amount of enantiomers that could be separated using the column procedure described in Examples 2–5 was relatively low. A batch procedure, in which larger amounts of enantiomers can be separated, was thus developed. Example 6 below describes experiments establishing the conditions for separation of D- and L-glucose on BioGel P-6 in a batch method. The preferred conditions for separation by the batch method are first determined by scanning solutions with concentrations of the racemic mixture of enantiomers, together with either a constant concentration of chaotrope and variable concentration of kosmotrope, or a constant concentration of kosmotrope and variable concentration of chaotrope. The preferred composition can be identified as the narrow range of compositions for which the gel volume is constant and maximal. Having identified the composition required to give maximal retention of D-glucose, the gel can be transferred to a column and eluted with a solution containing a solute which will selectively abolish the type of water retaining solute. In a polyamide gel, such as BioGel P-6, a chaotrope abolishes low density water. In a charged gel, such as Dowex, a kosmotrope abolishes low density water and a chaotrope abolishes high density water.

In order to optimize the batch method of separation of enantiomers, several variables must be tightly controlled. Since the enantiomers themselves are either chaotropes which partition into low density water and tend to induce high density water, or kosmotropes which partition into high density water and tend to induce low density water, there is no single protocol that will optimize separation of all racemic mixtures. For each racemic mixture, therefore, the type of scanning experiments described in Example 6 and illustrated in FIGS. 9–15, is initially necessary in order to determine the optima of time of mixing, concentration and identity of chaotrope, concentration and identity of kosmotrope, maximal useful concentration of racemate and volume of solution per gram of dry gel.

Stability of Gels

Polyamide gels in contact with water release $NH_3$ hydrolysed from end amide groups. This forms the powerful chaotrope $NH_4^+$, which interferes with separation unless the added chaotropes and kosmotropes are at high enough concentrations to predominate. Ion-exchange resins have highly reactive high density water immediately adjacent to their surfaces. This, with time, appears to cleave off fixed charge groups. Both polyamide gels and ion exchange resins, therefore, should be washed and dried between experiments and stored in the dry state.

Charged Gels

High capacity charged gels contain both high and low density water within their pores. Fixed charges ($—SO_3^-$, $—CO_2^-$, $—N(CH_3)_3^+$) are usually chaotropic, inducing high density water immediately at the surface. Counter-ions can be chaotropic ($K^+$, $NH_4+$, or $Cl^-$, $HCO_3^-$) or kosmotropic ($Na^+$, $Li^+$, $H^+$). The most effective counter-ions for separation are divalent ($Ca^{2+}$ or $Mg^{2+}$ or $SO_4^{2+}$). These ions induce stable populations of high and low density water inside the pores, with high density water containing the counter-ions immediately adjacent to the surface and contiguous microdomains of low density water.

Charged gels should be converted to the divalent counter-ion form, washed with water to remove excess electrolyte and dried before use. If they are then mixed with a suitable concentration of racemate in a horizontal column, the enantiomers can be eluted sequentially with a solution of a kosmotrope followed by a solution of a chaotrope. All solutes are eluted when the gel is neutralized.

Time of Mixing

Figure 11:
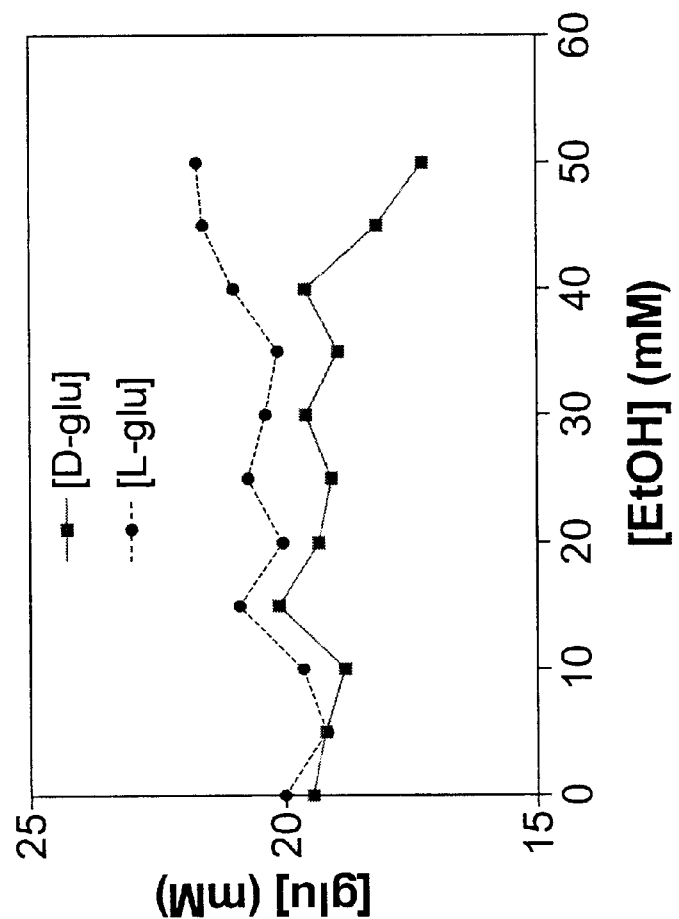
FIG. 11 illustrates the separation of D- and L-glucose in 0.5 g of a Bio-Gel P-4 gel mixed for 4 days at room temperature in 4 ml of solutions containing 5 mM potassium phosphate, pH 7, 3 mM sodium azide, 20 mM L-glucose, 20 mM D-glucose, 2 mM benzyl alcohol and graded concentrations of ethanol.
Figure 13:
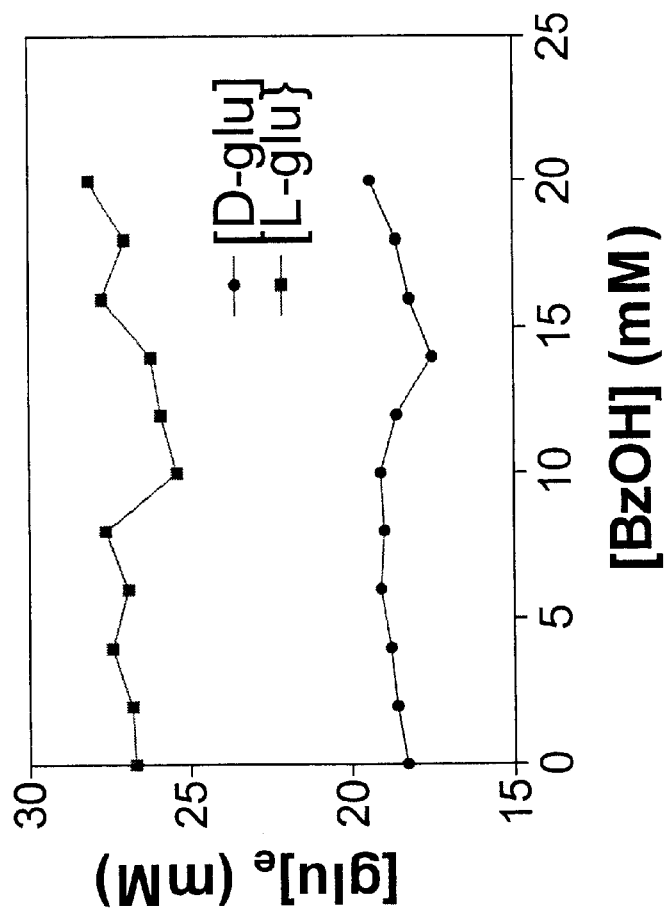
FIG. 13 illustrates the separation of D- and L-glucose in a Bio-Gel P-6 gel after 18 hours of mixing in a solution containing 25 mM tetramethyl ammonium chloride, 3 mM sodium azide, 20 mM D-glucose and 20 mM L-glucose, and graded concentrations of benzyl alcohol.
Figure 14:
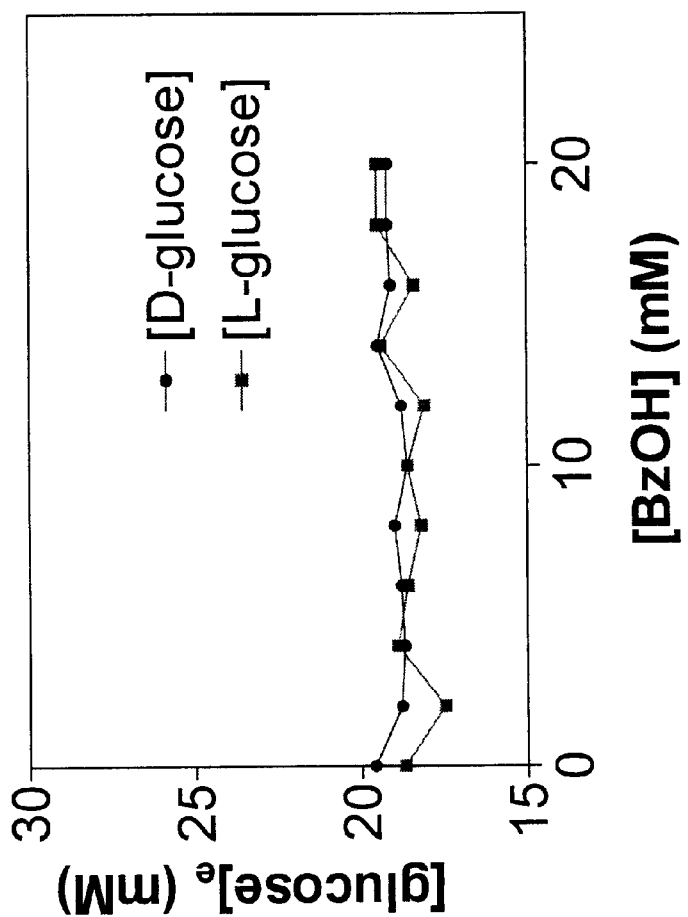
FIG. 14 shows the analysis of the experiment of FIG. 13 after 4 days of mixing.

The experiments shown in FIGS. 13 and 14 illustrate the importance of the time of mixing of gel and solution. After 1 day of mixing, separation of D- and L-glucose was good, but after 4 days there was no separation. The internal volume of microporous gel beads is known to oscillate with time over a period of days. The periodicity of these oscillations depends upon the particular gel, the potency of chaotrope and kosmotrope, the temperature and the volume of water per gram of dry gel. For example, 25 mM tetramethylammonium chloride gave good separation after overnight mixing (FIG. 15), but 5 mM potassium phosphate required four days of mixing for good separation (FIG. 11).

Volume of Solution/g Gel

The collapse of internal low density water takes place when the osmolality of the internal solution becomes greater than that of the external solution. This occurs earlier when the volume of external solution is decreased. A suitable value for the volume of solution per gram of dry gel must be selected and not changed over the scanning experiments.

Chaotropes and Kosmotropes

Since the enantiomers to be separated will inevitably, themselves, have chaotropic or kosmotropic properties, the chaotropes and kosmotropes used to control the separation must be potent. Strong chaotropes are univalent salts of $K^+$, $Rb^+$, $Cs^+$, $NH_4^+$ and tetramethylammonium ion. The preferred anions are $NO_3^-$, $HSO_4^-$, and $H_2PO_4^-$. The preferred chaotropic salt is $KNO_3$ because it is not complicated by an equilibrium for a doubly charged anion which is a kosmotrope.

When a chaotropic electrolyte is used, it is preferable to use a strong non-ionic kosmotrope, such as butanol or benzyl alcohol. These solvents have the added advantage that they can be eliminated from the final solutions by freeze-drying.

Water

The quality of water used in the scanning experiments and for washing the gel should be constant. The experiment illustrated in FIG. 8 used distilled, deionized water. When the experiment was repeated with MilliQ water, the minimum in pH shifted from 5 mM to 25 mM ethanol. Presumably the MilliQ water was of greater purity and retained fewer non-ionic kosmotropes which powerfully modify the properties of water even at trace concentrations. The studies shown in FIGS. 9 to 15 used MilliQ water. The absolute properties of water are not important, but they must be constant if the separations are to be reproducible.

Concentration of Racemate

The concentration of racemate must be high enough that useful levels of separation are obtained, but not high enough to control the separation of water domains entirely. When one enantiomer is a chaotrope and the other a kosmotrope, they will contribute to their separation by stabilizing low density water while it accumulates the chaotrope. In general, however, they should be at low enough concentrations that added solutes control the separation process.

Pressure and Temperature

Both increased pressure and temperature increase high density water at the expense of low density water. Temperature must be kept constant, therefore, for the scanning experiments. If the gel is poured into a column for the final separation of internal and external solutes, the column must be held horizontally and solutions pumped through with the minimum of pressure, so that low density water is not demolished prematurely. Alternatively, an increase in pressure may be employed to break down the regions of low density water with a resulting release of the chaotropic enantiomer. While the experiments described herein were all performed at room temperature, it is probable that higher temperatures would give greater separations in shorter times.

A scanning experiment to establish the optimal conditions for separation of a racemate may be performed using the following general procedures. Washed and dried BioGel P-6 is mixed with a solution containing 25 mM tetramethyl ammonium chloride, 10 mM butanol, 40 mM racemate, 3 mM sodium azide and graded concentrations of benzyl alcohol. Tubes are mixed for 20 hours, gel allowed to settle, and the height of the gel in the tube measured (as in FIG. 9). Mixing is continued and the gel heights measured at time intervals to determine the critical composition range for which the gel volume is a maximum as a function of time of mixing. Since no supernatant need be removed when only gel heights are estimated, the ratio of solution volume to gel weight is constant. With strong kosmotropes (such as butanol and benzyl alcohol) there appears to be a range of solution compositions giving some separation (see for example, FIGS. 13 and 15).

A definitive experiment can then be set up and analyzed in a polarimeter. Following the initial mixing, the gel slurry should be transferred to a rocking column for the predetermined time, and eluted, using a pump with slow flow rate, from the horizontal column, first with the mixing solution without the racemic mixture, and then with 50 mM $KNO_3$.

The present invention is illustrated by reference to the following experimental protocols and results. The experimental protocols and results support the specification and claims and should not be construed to limit the invention, as claimed, in any fashion.

EXAMPLE 1

Effect of Varying Concentrations of External Kosmotrope on Gel Swelling

Figure 8:
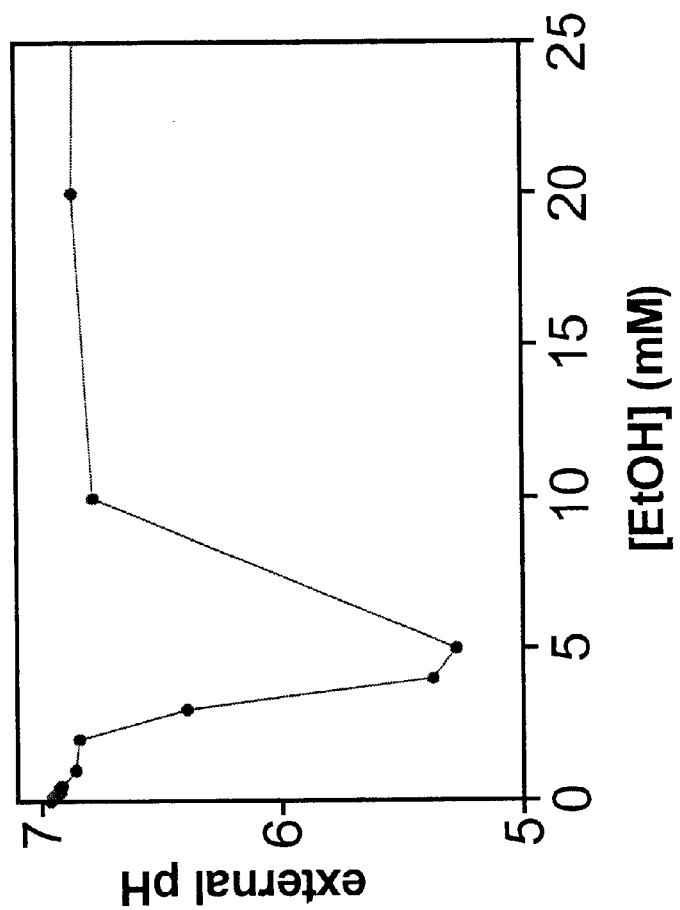
FIG. 8 illustrates the effect of graded concentrations of ethanol on the external pH of 5 mM potassium phosphate (initially pH 7).

FIG. 8 illustrates the experimental design which was followed, with some modifications, in all experiments. In this experiment, 0.3 g of Bio-Gel P-6 gel was equilibrated over 6 days with solutions containing 5 mM potassium phosphate, pH 7, containing graded concentrations of ethanol. The end-point measured was the pH of the external solution. As the concentration of ethanol increased, a slight decrease in external pH was first observed which suddenly accelerated and assumed a minimal level (pH 5.3) at 5 mM ethanol. At 10 mM of ethanol, the pH had returned to 7. This is an example of the power of balancing external kosmotrope (ethanol, $HPO_4^{2-}$ and $H^+$) with internal chaotrope ($K^+$ and $H_2PO_4^-$). The gel at first swelled with uptake of chaotrope and water, and stopped swelling when the osmotic pressure of the external solution exactly balanced that of the internal solution. This was the composition of solution which gave maximal retention of low density water inside the gel pores. Addition of further ethanol induced loss of internal water to balance the increased external osmotic pressure. With loss of internal water, the internal chaotrope concentrated and induced high density water inside the gel pores. Pore water then lost its selectivity for the chaotrope, which diffused out.

EXAMPLE 2

Separation of D-Glucose and L-Glucose on a Polyamide Gel Column

Unless otherwise indicated, in all experiments D-glucose was estimated using an Esprit Glucometer (BayerCorp., N.Y.). Standard solutions were diluted 1:1 with 4% polyethylene glycol 20M (BDH 298644E) to approximate the viscosity of blood for which the glucometer was designed. Corrections sometimes had to be made for changes in viscosity caused by varying chaotrope or kosmotrope in the sample solutions. The glucometer did not respond to L-glucose. L-glucose was labeled with $^{14}C$ and counted in a Wallac Microbeta Plus™ liquid scintillation counter. All solutions contained 3 mM sodium azide which ensured that microorganisms were absent but did not inhibit the glucose oxidase in the glucometer.

Two matched columns containing 1 g of BioGel P-6 were pretreated with two bed volumes of 0.2 M n-butanol for 24 h. Sequential experiments were carried out. In the first, 1 ml of $^{14}C$-labeled D-glucose, 20 mM D-glucose, and 20 mM L-glucose in 0.2 M n-butanol was put on the column and eluted with 0.2 M n-butanol. In the second experiment, 1 ml of $^{14}C$-labeled L-glucose, 20 mM L-glucose and 20 mM D-glucose was put on the column and eluted with 0.2 M butanol. Fractions were counted using a liquid scintillation counter.

As shown in FIG. 1, the elution patterns for L-glucose and D-glucose were different. Specifically, fractions 9–14 were enriched in L-glucose and fractions 14 to 29 were enriched in D-glucose. In these experiments, D-glucose, itself, was the chaotrope which induced high density water inside the gel, with resulting rapid loss of D-glucose and slight retention of L-glucose (fractions 29–40).

EXAMPLE 3

Separation of L-Lysine and D-Lysine on a Polyamide Gel Column

Figure 2:
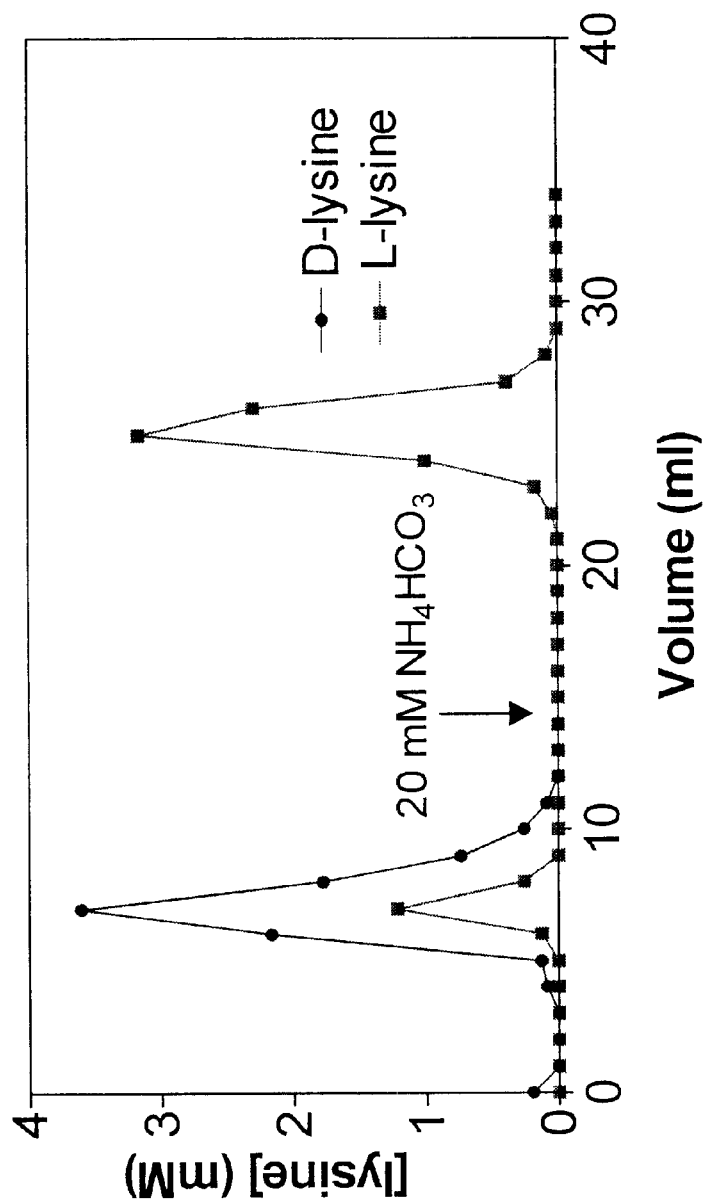
FIG. 2 illustrates the elution of D- and L-lysine from a Bio-Gel P-6 column. 1 g P-6 gel was pre-treated with 50 mM n-BuOH for 21 h; 1 ml of 20 mM L-lysine, 20 mM L-lysine, and 40 mM n-BuOH containing [14]C-L-lysine was put on the column and eluted with 15 ml of 50 mM n-BuOH, followed by 20 mM $NH_4HCO_3$. Total lysine was determined from its absorbance relative to that of 50 mM BuOH at 210 nm, using a standard curve of lysine in 50 mM BuOH, and diluting samples, where necessary, in 50 mM BuOH. L-Lysine was determined by scintillation counting and D-lysine was determined by difference. Following addition of $NH_4HCO_3$, total lysine could not be determined. This pattern of elution was reproducible on the same batch of gel.

A column containing 1 g Bio-Gel P-6 gel was pretreated with 50 mM n-butanol for 21 hours. 1 ml of a solution containing 20 mM L-lysine, 20 mM D-lysine, 40 mM n-butanol and $^{14}C$-L-lysine was put on the column and eluted with 15 ml 50 mM n-butanol followed by 20 ml of 20 mM $NH_4HCO_3$. Total lysine was determined from its absorbance relative to that of n-butanol at 210 nm, using a standard curve of lysine in 50 mM n-butanol. L-lysine concentration was determined by scintillation counting. Following addition of $NH_4HCO_3$, total lysine could not be measured. As shown in FIG. 2, L-lysine was retained on the column in low density water, which was then demolished by the potent chaotrope, $NH_4HCO_3$, with resulting release of L-lysine. D-lysine concentration was obtained by difference.

Figure 3:
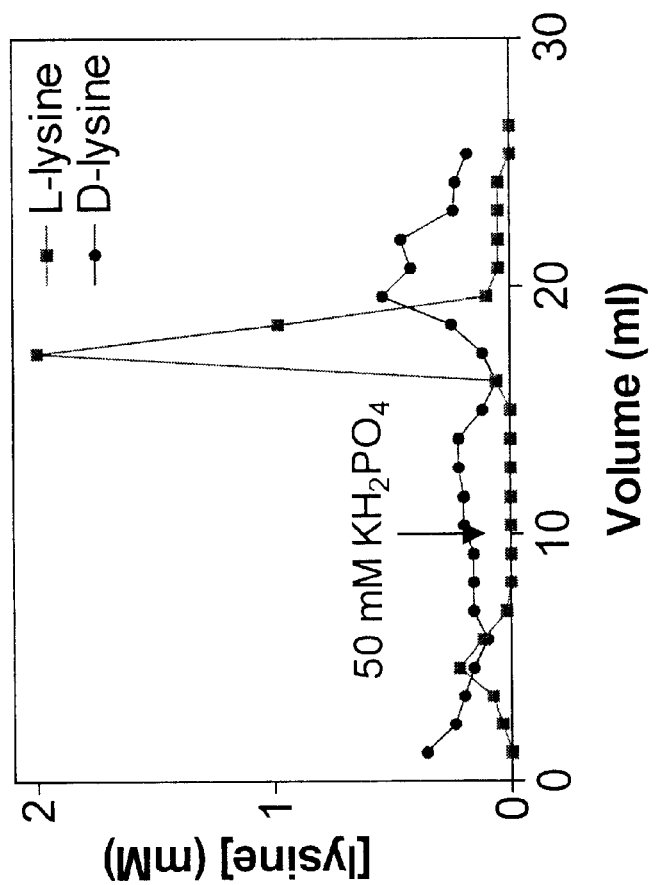
FIG. 3 illustrates the elution of D- and L-lysine from a different batch of Bio-Gel P-6. The method employed was the same as that for FIG. 2 except that the concentrations of D- and L-lysine were 10 mM and the second eluting solution was 50 mM $KH_2PO_4$. By making corrections for (i) the effects of changing solution composition on the absorbance of lysine at 210 nm, and (ii) $NH_3$ eluted from the gel, total lysine was measured up to 30 ml. These results were highly reproducible on this batch of gel. Both D- and L-lysine were totally recovered.

The properties of Bio-Gel P-6 were found to vary from batch to batch. In this experiment, using a different batch of Bio-Gel P-6, 10 mM of each of D- and L-lysine, and 50 mM $KH_2PO_4$ as the second elution solution, the elution patterns were different to those described above. By making corrections for (i) the effects of changing solution composition on the absorbance of lysine at 210 nm, and (ii) $NH_3$ produced from the gel and eluted with lysine, total lysine was measured up to 30 ml. As shown in FIG. 3, both D- and L-lysine were totally recovered.

EXAMPLE 4

Separation of L-Glutamate and D-Glutamate on an Ion Exchange Resin Column

Figure 4:
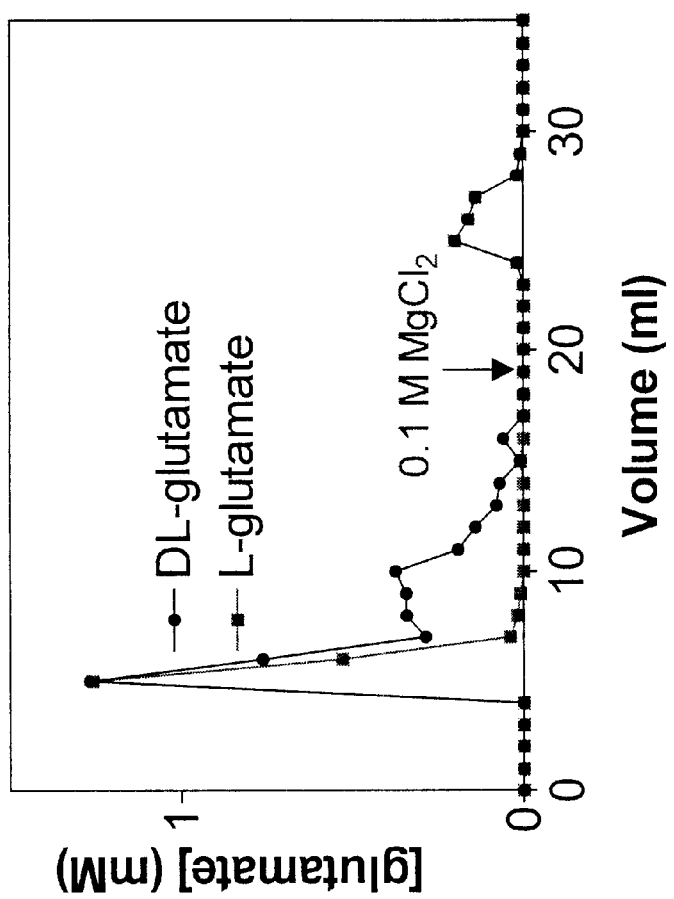
FIG. 4 illustrates the elution of $K^+$-DL-glutamate and of $K^+$-L-glutamate from Dowex 50Wx16 after 12 days of preequilibration with water. L-glutamate was labeled with $^{14}C$, and DL-glutamate was estimated by absorption at 210 nm.
Figure 5:
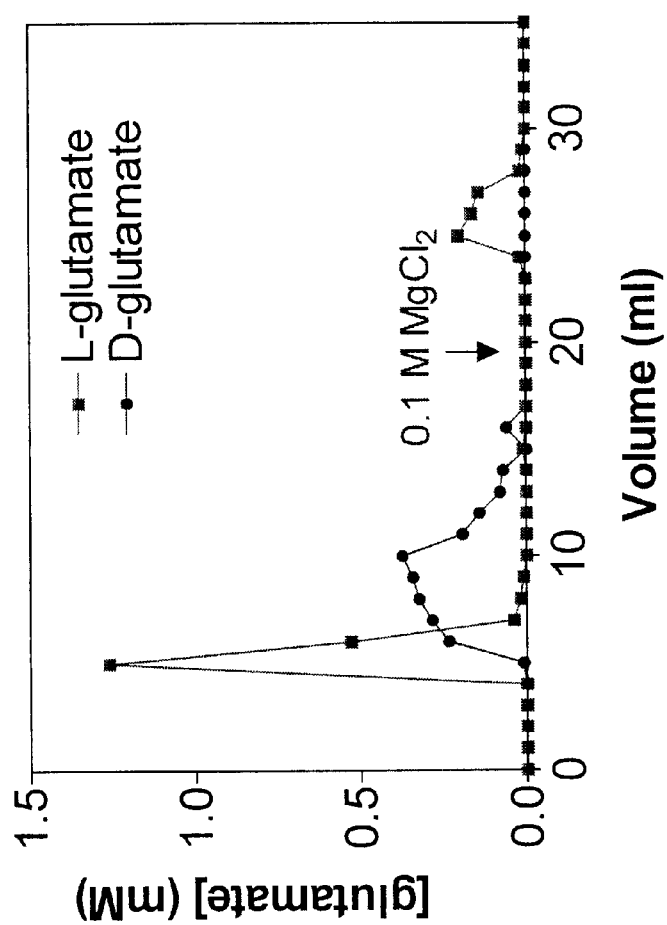
FIG. 5 illustrates the elution of $K^+$-D-glutamate and $K^+$-L-glutamate from Dowex 50Wx16, obtained by difference from FIG. 4.

Dowex 50Wx16 (Dow Chemical Company, Midland, Mich.) in its sodium form was pre-equilibrated in water for 12 days. 1 ml of 20 mM potassium D-glutamate, 20 mM potassium L-glutamate and $^{14}C$ L-glutamate was put on the column and eluted with 19 ml of water, followed by 15 ml of 0.1 M $MgCl_2$. L-Glutamate was determined by scintillation counting of $^{14}C$ and total glutamate by absorbance at 210 nm. Corrections had to be made for a solute, eluted from the gel, which absorbed at 210 nm but which was not glutamate. FIG. 4 shows the elution pattern of L- and DL-glutamate, with FIG. 5 showing the elution of D-glutamate, obtained by difference. Most L-glutamate eluted with water, with the rest being subsequently eluted with the kosmotrope $MgCl_2$. D-Glutamate was retained on the gel, presumably in high density water. $MgCl_2$ partitioned into high density water, increasing its volume at the expense of low density water so that L-glutamate was concentrated in low density water, thereby inducing high density water, and was eluted. Any residual D-glutamate would be eluted by a solution of a chaotrope. Dowex 50Wx16 is a strongly negatively charged gel which, here, has retained the anion D-glutamate. The time of pre-treatment of gels with water or kosmotropic solution is critical to the result. The necessity of a long pre-treatment period is due to the need for the gel surface to modify itself with time to maximise the formation of high and low density microdomains. The Dowex cross-linked gel matrix is in a glassy or rubbery state and therefore very slow to move.

Figure 6:
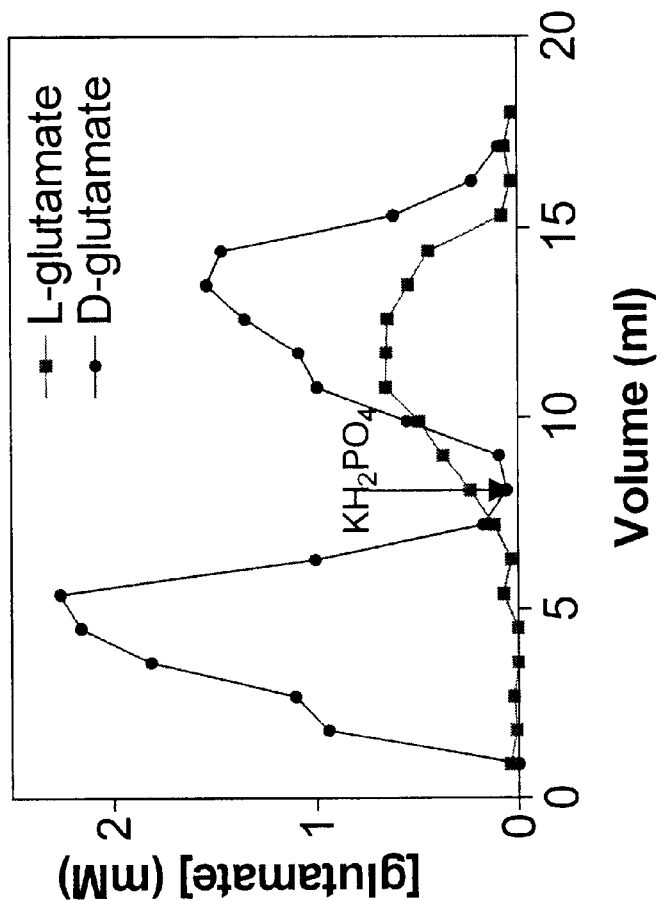
FIG. 6 illustrates the elution of $K^+$-D-glutamate and $K^+$-L-glutamate from Dowex 50 W in its $K^+$ form.

In subsequent experiments, Dowex 50Wx16 was converted to its $K^+$ form and well-washed with 0.2 M butanol to remove excess ions. After 8 days, 0.5 ml of 20 mM potassium D-glutamate, 20 mM L-glutamate and $^{14}C$-L-glutamate in 0.2 M butanol was put on the column and eluted with 8 ml 0.2 M butanol followed by 0.1 M $KH_2PO_4$. Previous experiments have shown that the properties of water in a charged gel are exquisitely sensitive to the counter-ion. With $K^+$ as the counter-ion, more low density water is induced than when $Na^+$ is the counter-ion. Accordingly, in this experiment, half of the D-glutamate was eluted with butanol and the rest with the chaotrope $KH_2PO_4$ which, at a charged surface, induces low density water, eluting the kosmotropic D-glutamate. L-glutamate was most strongly retained on the column, with only 40% being eluted. These results are shown in FIG. 6.

EXAMPLE 5

Separation of Chloroquine Phosphate on a Polyamide Gel Column

Figure 7:
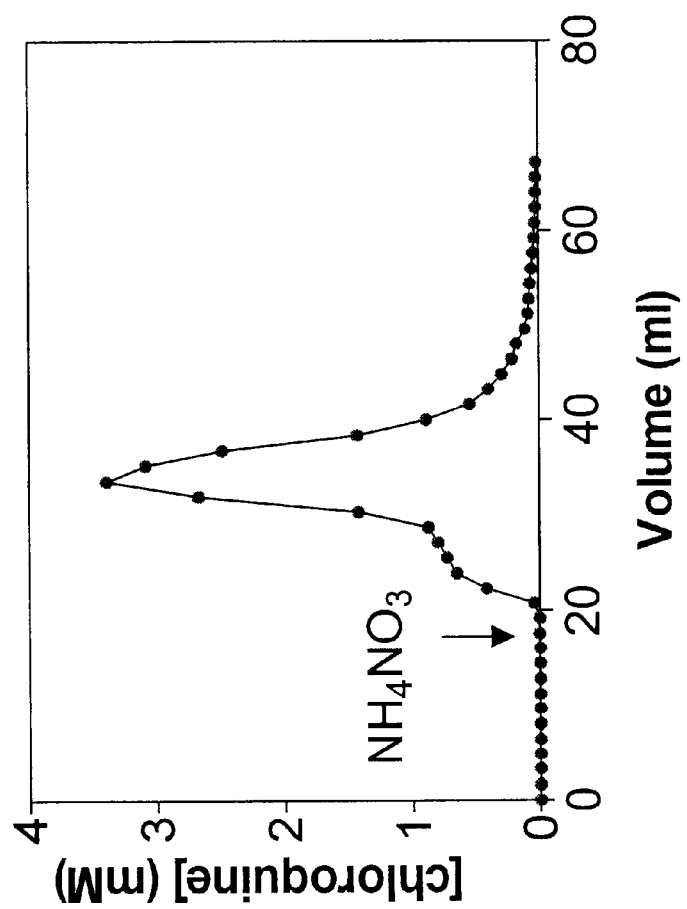
FIG. 7 illustrates the elution of DL chloroquine phosphate from a Bio-Gel P-6 column. 1 g Bio-Gel P-6 was pretreated with water overnight. 1 ml 20 mM DL chloroquine phosphate was put on the gel and eluted with 20 ml water followed by 50 ml of 50 mM $NH_4NO_3$.

Chloroquine phosphate (ICI Pharmaceuticals Division, Bridgewater, N.J.) is a racemic mixture of a drug. 1 ml of 20 mM DL-chloroquine phosphate was put on a Bio-Gel P-6 column pretreated with water for 21 hours, and eluted with 14 ml of water followed by 50 ml of 50 mM $NH_4NO_3$. Total chloroquine in the fractions was estimated by absorbance at 240 nm. As shown in FIG. 7, while no drug was eluted with water, all the drug eluted following abolition of internal low density water by addition of the chaotrope 50 mM $NH_4NO_3$. The solute appears to have eluted in two fractions as evidenced by the shoulder on the peak.

EXAMPLE 6

Figure 9:
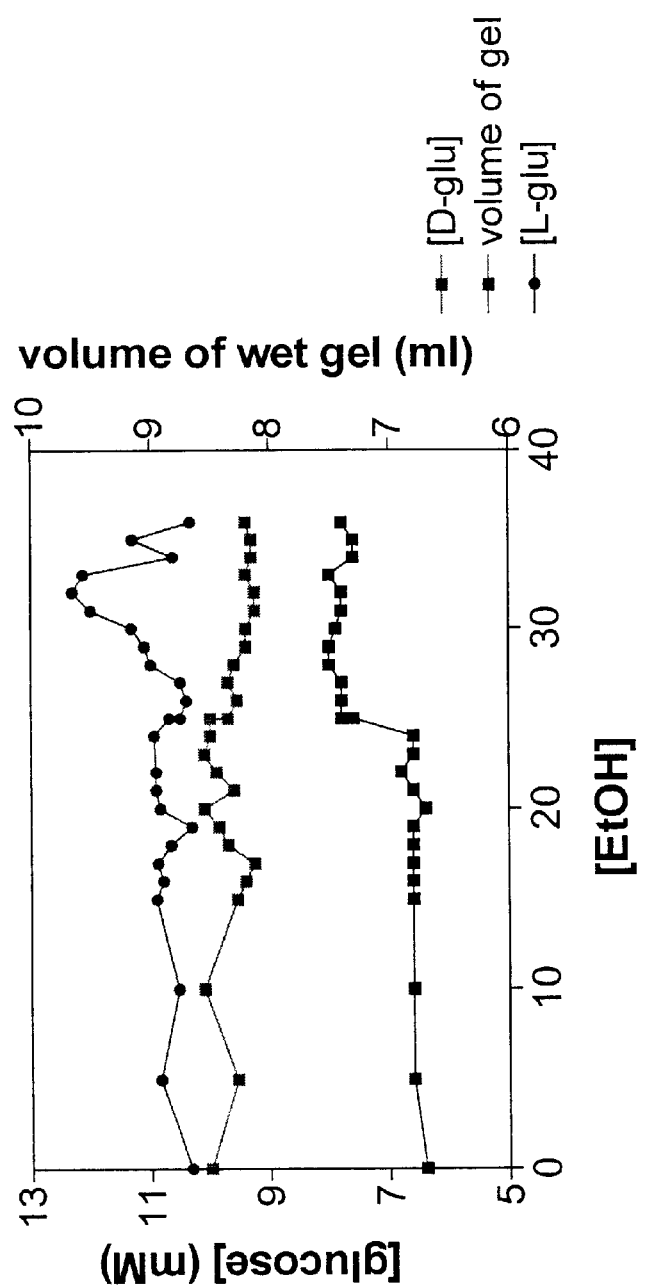
FIG. 9 illustrates the separation of D- and L-glucose in 1 g of washed Bio-Gel P-6 mixed for 18 hours in 7.5 ml solutions containing 5 mM tetramethyl ammonium chloride, 10 mM D-glucose, 10 mM L-glucose, 3 mM sodium azide and graded concentrations of ethanol.

Optimization of Conditions for Separation of D-Glucose and L-Glucose using a Batch Method 1 g of washed and dried Bio-Gel P-6 was weighed into each of a series of 15 ml calibrated centrifuge tubes and 7.5 ml of solution added. Solutions contained 10 mM D-glucose, 10 mM L-glucose, 5 mM tetramethyl ammonium chloride, 3 mM sodium azide, $^{14}C$-L-glucose and concentrations of ethanol ranging from 0–40 mM. Tubes were mixed on a rotating mixer at 21° C. for 20 hours, the gel allowed to settle and supernatants analyzed for D- and L-glucose. In these experiments, tetramethyl ammonium chloride was the constant chaotrope and ethanol the variable kosmotrope. The results are shown in FIG. 9. The volume of gel in the calibrated tube was estimated by eye and was found to be fairly constant from 0 to 24 mM ethanol and then rather abruptly increased and levelled out. At this largely constant degree of swelling, the supernatant, or external solution, increased to a maximum concentration of L-glucose and decreased in D-glucose concentration. The tube with the greatest separation of D- and L-glucose had a ratio of D:L of 0.75:1.

Figure 10:
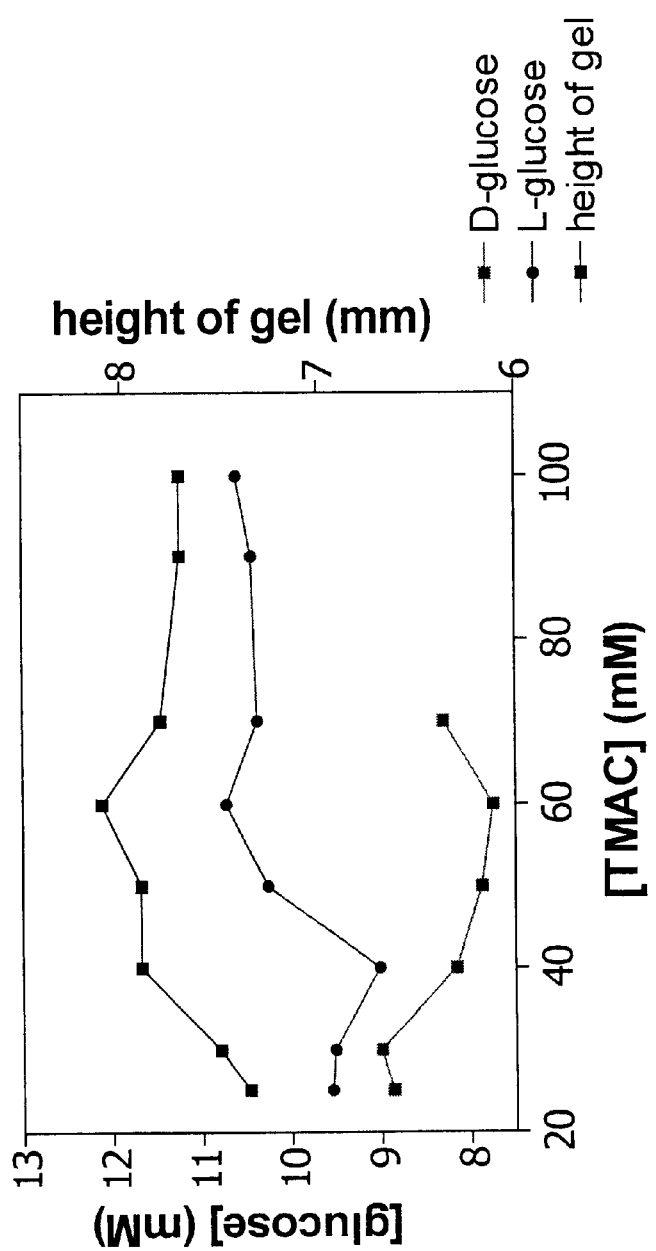
FIG. 10 illustrates the separation of D- and L-glucose in a Bio-Gel P-6 gel after 2 days of mixing in solutions containing 20 mM ethanol, 3 mM sodium azide, 10 mM D-glucose, 10 mM L-glucose and graded concentrations of tetramethylammonium chloride.

In further experiments, 1 g of Bio-Gel P-6 was weighed into each of a series of 15 ml calibrated centrifuge tubes and put on the mixer in 8 ml solution and mixed for 46 hours. Solutions contained 10 mM D-glucose, 10 mM L-glucose, $^{14}C$-L-glucose, 3 mM sodium azide, 20 mM ethanol and concentrations of tetramethyl ammonium chloride ranging from 25 to 100 mM. This is the reciprocal of the experiment shown in FIG. 9. The kosmotrope (ethanol) was at a constant concentration and the chaotrope (tetramethylammonium chloride) varied from 25 to 100 mM. As shown in FIG. 10, there was a clear maximum in L-glucose concentration, minimum in D-glucose concentration and maximum in gel volume at approximately 60 mM tetramethyl ammonium chloride. The ratio of D- to L-glucose at this point was 0.72:1.

In subsequent experiments, 0.5 g BioGel P-4 was weighed into each of a series of tubes and mixed at 21° C. with 4 ml solution over 4 days. Solutions contained 20 mM L-glucose, 20 mM D-glucose, $^{14}C$-L-glucose, 5 mM potassium phosphate pH 7, 2 mM benzyl alcohol, 3 mM sodium azide and graded concentrations of ethanol from 0–50 mM. The results are shown in FIG. 11. Separation was continuing at 50 mM ethanol, at which point the ratio of D- to L-glucose was 1:0.79.

Figure 12:
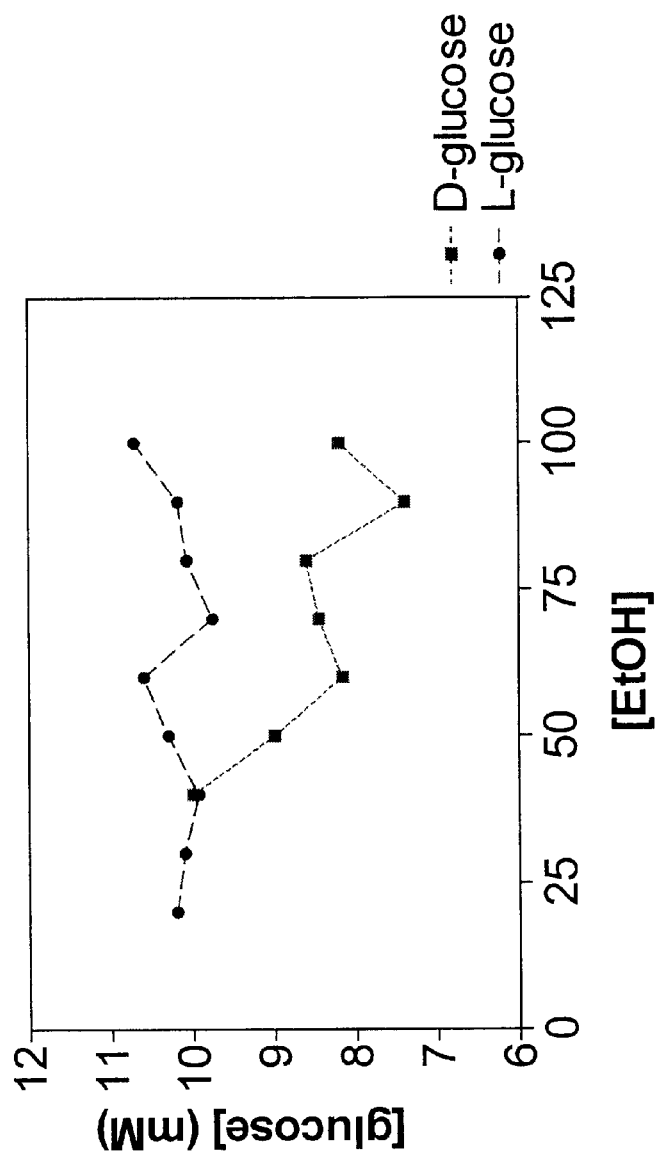
FIG. 12 illustrates the separation of D- and L-glucose in 0.4 g of a Bio-Gel P-6 gel mixed for 18 hours in 4 ml of solutions containing 50 mM tetramethyl ammonium chloride, 10 mM D-glucose, 10 mM L-glucose, 3 mM sodium azide and graded concentrations of ethanol.

FIG. 12 shows the results of experiments in which 0.4 g washed Bio-Gel P-6 was weighed into each of a series of tubes and mixed with 4 ml solution for 21 hours. Solutions contained 50 mM tetramethyl ammonium choride, 10 mM D-glucose, 10 mM L-glucose, $^{14}C$-L-glucose, 3 mM sodium azide and graded concentrations of ethanol from 0 to 100 mM.

In further experiments, 0.5 g of washed Bio-Gel P-6 was weighed into each of a series of tubes and mixed for 21 hours at room temperature in 4 ml solution. Solutions contained 25 mM tetramethyl ammonium chloride, 20 mM D-glucose, 20 mM L-glucose $^{14}$C-L-glucose, 3 mM sodium azide, 10 mM butanol and variable concentrations of benzyl alcohol from 0 to 20 mM. These solutions contained both a strong chaotrope (tetramethyl ammonium chloride) and strong kosmotropes (butanol and benzyl alcohol). FIG. 13 shows the result after 21 hours of mixing. The average ratio of D- to L-glucose was 0.69:1 and this was maintained over a quite wide range of concentrations of benzyl alcohol, because the solutions also had the constant concentration of n-butanol (10 mM). The combination of strong chaotrope and strong kosmotrope allowed good separation of the enantiomers.

FIG. 14, however, shows the results after 4 days of mixing. These were the same samples as those shown in FIG. 13, put back on the mixer after removal of 120 µl of supernatant for analysis. After 4 days of mixing there was no separation of the enantiomers at all. It has been shown in other experiments that the internal volume of microporous gel beads oscillates with time over a period of days (Wiggins, P M, (1995): Microosmosis, a chaotic phenomenon of water and solutes in gels. *Langmuir* 11: 1984–1986). The maximal internal volume coincides with maximal separation of low density and high density microdomains. In this example, therefore, it seems probable that separation of microdomains was high after 21 hours of mixing, but zero after 4 days of mixing. The slowness of these volume changes is due to the slow movement of the cross-linked gel matrix which has to adapt to the influx or efflux of water in response to uptake and release of chaotropes.

Figure 15:
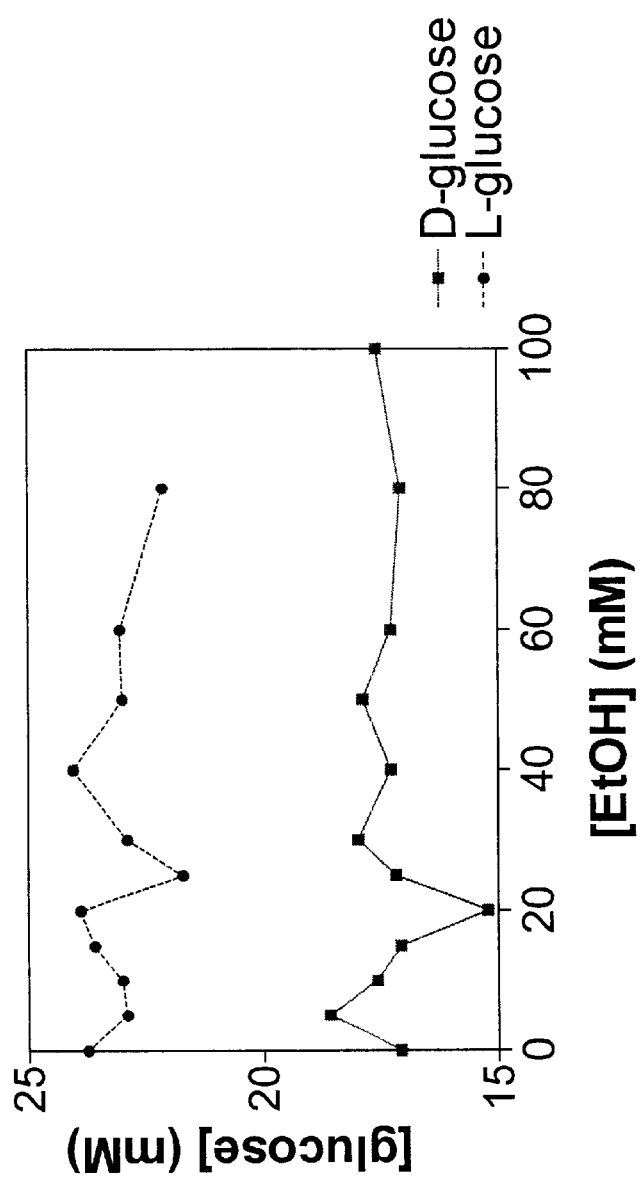
FIG. 15 illustrates the separation of D- and L-glucose after 23 hours of mixing in solutions containing 25 mM tetramethylammonium chloride, 20 mM D-glucose, 20 mM L-glucose, 3 mM sodium azide, 10 mM n-butanol and graded concentrations of ethanol.

In yet further experiments, 0.4 g fresh Bio-Gel P-6 was weighed into each of a series of tubes and mixed in 4 ml of solution for 23 hours at 21° C. Solutions contained 25 mM tetramethyl ammonium chloride, 20 mM D-glucose, 20 mM L-glucose, 10 mM BuOH, $^{14}$C-L-glucose, 3 mM sodium azide and graded concentrations of ethanol from 0 to 100 mM. FIG. 15 shows the results. Again, in the presence of a strong kosmotrope (butanol) there was a degree of separation at all concentrations of ethanol. However, there was a point of maximal separation at 20 mM ethanol for which the ratio of D- to L-glucose in the external solution was 1:0.64. This sample of Bio-Gel P-6 was used as obtained from the makers (BioRad Laboratories) without washing so that it contained some preservative, presumably ethanol or other kosmotrope, which adds an unknown kosmotropic influence on the separation. All other experiments used gel washed in water and dried at 110 ° C.

These experiments demonstrate that the batch method may be employed to enrich the internal solution with D-glucose and enrich the external solution with L-glucose.

All references and other materials cited herein are incorporated by reference in their entirety. While in the foregoing specification this invention has been described in relation to certain preferred embodiments thereof, and many details have been set forth for purposes of illustration, it will be apparent to those skilled in the art that the invention is susceptible to additional embodiments and that certain of the details described herein may be varied considerably without departing from the basic principles of the invention.

I claim:

1. A method of separating at least two enantiomers in a racemic mixture, the method comprising differentially partitioning the enantiomers into regions of low density water and high density water abutting a porous surface, wherein one of the enantiomers is chaotropic and the other of the enantiomers is kosmotropic, and wherein the chaotropic enantiomer is selected from the group consisting of: D-glucose and L-amino acids; and the kosmotropic enantiomer is selected from the group consisting of: L-glucose and D-amino acids.

2. A method for separating a racemic mixture of a kosmotropic enantiomer and a chaotropic enantiomer, the method comprising:
   (a) providing a matrix of small-pored beads comprising pores of less than 3 nm in diameter;
   (b) stabilizing microdomains of high density water and low density water within the matrix, whereby the osmotic pressure in the high density microdomains is equal to that in the low density microdomains;
   (c) contacting the stabilized matrix with the mixture of enantiomers; and
   (d) breaking down low density water in the matrix whereby the chaotropic enantiomer is eluted from the gel.

3. A method of separating at least two enantiomers in a racemic mixture, the method comprising differentially partitioning the enantiomers into regions of low density water and high density water abutting a porous surface, wherein one of the enantiomers is chaotropic and the other of the enantiomers is kosmotropic, and wherein the separation of enantiomers is accomplished by:
   (a) balancing a concentration of kosmotropes in a solution external to pores within the porous surface with a concentration of chaotropes in a solution contained within the pores within the porous surface, whereby the regions of low and high density water are stabilized and wherein the osmotic pressure within the pores is equal to that external to the pores;
   (b) contacting the porous surface with the racemic mixture of enantiomers for sufficient time for partitioning to occur, wherein the chaotropic enantiomer partitions into low density water and the kosmotropic enantiomer partitions into high density water; and
   (c) removing the solution external to the pores, wherein the chaotropic enantiomer is retained selectively in low density water within the pores.

4. A method of separating at least two enantiomers in a racemic mixture, the method comprising differentially partitioning the enantiomers into regions of low density water and high density water abutting a porous surface, wherein one of the enantiomers is chaotropic and the other of the enantiomers is kosmotropic, and wherein the separation of enantiomers is accomplished by:
   (a) balancing the concentration of kosmotropes in a solution external to pores within the porous surface with the concentration of chaotropes in a solution contained within the pores within the porous surface, whereby the osmotic pressure within the pores is equal to that external to the pores;
   (b) contacting the porous surface with the racemic mixture of enantiomers to be separated for sufficient time for partitioning to occur, wherein the chaotropic enantiomer partitions into low density water and the kosmotropic enantiomer partitions into high density water;
   (c) removing the chaotropic enantiomer by converting low density water to high density water; and
   (d) removing the kosmotropic enantiomer by converting high density water to low density water.

5. A method for separating a racemic mixture of a kosmotropic enantiomer and a chaotropic enantiomer, the method comprising:
   (a) providing a matrix of small-pored beads comprising pores of less than 3 nm in diameter;

(b) stabilizing microdomains of high density water and low density water within the matrix, whereby the osmotic pressure in the high density microdomains is equal to that in the low density microdomains;

(c) contacting the stabilized matrix with the mixture of enantiomers;

(d) contacting the matrix with a solution that breaks down low density water in the matrix whereby the chaotropic enantiomer is eluted from the gel; and (e) contacting the matrix with a solution that stabilizes low density water in the matrix, whereby the kosmotropic enantiomer is eluted from the matrix.

6. The method of claim 5, wherein the microdomains of high density water and low density water are stabilized by contacting the beads with a solution of a kosmotrope.

7. The method of claim 5, wherein the pores in the beads are less than 3 nm in diameter.

8. The method of claim 5, wherein the chaotropic enantiomer is selected from the group consisting of: D-glucose and L-amino acids; and the kosmotropic enantiomer is selected from the group consisting of: L-glucose and D-amino acids.

9. The method of claim 5, wherein the matrix of small-pored beads is a polyamide gel.

10. The method of claim 9, wherein the solution that breaks down low density water comprises a chaotrope and the solution that stabilizes low density water comprises a kosmotrope.

11. The method of claim 10, wherein the chaotrope is selected from the group consisting of: $K^+$, $Rb^+$, $Cs^+$, $HCO_3^-$, $H_2PO_4^-$, $NO_3^-$, $HSO_4^-$, and tetramethyl ammonium ion.

12. The method of claim 10, wherein the kosmotrope is selected from the group consisting of: $Mg^{2+}$, $Ca^{2+}$, $H^+$, $Li^+$, $Na^+$, $SO_4^-$, $HPO_4^-$, $F^-$ and $OH^-$.

13. The method of claim 9, wherein the solution that stabilizes low density water is a hydrophobic solute.

14. The method of claim 13, wherein hydrophobic solute is selected from the group consisting of: ethanol, propanol benzyl alcohol and butanol.

15. The method of claim 5, wherein the matrix of small-pored beads is an ion exchange resin.

16. The method of claim 15, wherein the chaotropic enantiomer is eluted by contacting the matrix with a solution of a kosmotrope.

17. The method of claim 15, wherein the kosmotropic enantiomer is eluted by contacting the matrix with a solution of a chaotrope.

18. The method of claim 17, wherein the chaotrope is selected from the group consisting of: $K^+$, $Rb^+$, $Cs^+$, $HCO_3^-$, $H_2PO_4^-$, $NO_3^-$, $HSO_4^-$, and tetramethyl ammonium ion.

19. The method of claim 16, wherein the kosmotrope is selected from the group consisting of: $Mg^{2+}$, $Ca^{2+}$, $H^+$, $Li^+$, $Na^+$, $SO_4^{2-}$, $HPO_4^{2-}$, $F^-$ and $OH^-$.

* * * * *

UNITED STATES PATENT AND TRADEMARK OFFICE
CERTIFICATE OF CORRECTION

PATENT NO.    : 6,638,360 B1
DATED         : October 28, 2003
INVENTOR(S)   : Phillipa M. Wiggins It is certified that error appears in the above-identified patent and that said Letters Patent is hereby corrected as shown below:

Column 14,
Line 6, replace "$Na^+, SO_4^-, HPO_4^-, F^-$ and $OH^-$." with -- $Na^+, SO_4^{2-}, HPO_4^{2-}, F^-$ and $OH^-$. --

Signed and Sealed this

Sixth Day of July, 2004

JON W. DUDAS
*Acting Director of the United States Patent and Trademark Office*